(12) United States Patent
Burns (10) Patent No.: US 6,919,626 B2
(45) Date of Patent: Jul. 19, 2005

(54) HIGH DENSITY INTEGRATED CIRCUIT MODULE

(75) Inventor: Carmen D. Burns, Austin, TX (US)

(73) Assignee: Staktek Group L.P., Austin, TX (US)

( * ) Notice: Subject to any disclaimer, the term of this patent is extended or adjusted under 35 U.S.C. 154(b) by 130 days.

(21) Appl. No.: 09/761,210

(22) Filed: Jan. 16, 2001

(65) Prior Publication Data

US 2001/0005042 A1 Jun. 28, 2001

Related U.S. Application Data

(62) Division of application No. 09/222,263, filed on Dec. 28, 1998, now Pat. No. 6,205,654, which is a continuation-in-part of application No. 08/774,699, filed on Dec. 26, 1996, now abandoned, which is a continuation of application No. 08/497,565, filed on Jun. 30, 1995, now Pat. No. 5,631,193, which is a continuation of application No. 07/990,334, filed on Dec. 11, 1992, now Pat. No. 5,484,959.

(51) Int. Cl.[7] .............................................. H01L 23/02
(52) U.S. Cl. ........................ 257/686; 257/692; 257/724; 257/730
(58) Field of Search ................................. 257/685, 686, 257/690–693, 723, 724, 730, 735; 361/772–774, 776, 790

(56) References Cited

U.S. PATENT DOCUMENTS

| | | | |
|---|---|---|---|
| 3,246,386 A | 4/1966 | Ende | 29/155.5 |
| 3,287,606 A | 11/1966 | Schwartz | 317/101 |
| 3,290,559 A | 12/1966 | Kirby | 317/101 |
| 3,313,986 A | 4/1967 | Kilby | 317/101 |
| 3,377,516 A | 4/1968 | Ellett | 317/101 |
| 3,403,300 A | 9/1968 | Horowitz et al. | 317/101 |
| 3,436,604 A | 4/1969 | Hyltin et al. | 317/101 |
| 3,515,949 A | 6/1970 | Michaels | 317/101 |
| 3,535,595 A | 10/1970 | Moore | 317/101 |

(Continued)

FOREIGN PATENT DOCUMENTS

| | | |
|---|---|---|
| EP | 122-687 A | 10/1984 |
| EP | 0 298 211 A3 | 1/1989 |

(Continued)

OTHER PUBLICATIONS

Dense–Pac Microsystems, Inc., Catalog describing two products: DPS512X16A3 Ceramic 512KX16 CMOS SRAM Module, pp. 865–870.

(Continued)

Primary Examiner—Alonzo Chambliss
(74) Attorney, Agent, or Firm—Andrews Kurth LLP (57) ABSTRACT

The present invention provides a method and apparatus for fabricating densely stacked ball-grid-array packages into a three-dimensional multi-package array. Integrated circuit packages are stacked on one another to form a module. Lead carriers provide an external point of electrical connection to buried package leads. Lead carriers are formed with apertures that partially surround each lead and electrically and thermally couple conductive elements or traces in the lead carrier to each package lead. Optionally thin layers of thermally conductive adhesive located between the lead carrier and adjacent packages facilitates the transfer of heat between packages and to the lead carrier. Lead carriers may be formed of custom flexible circuits having multiple layers of conductive material separated by a substrate to provide accurate impedance control and providing high density signal trace routing and ball-grid array connection to a printed wiring board.

13 Claims, 4 Drawing Sheets

U.S. PATENT DOCUMENTS

| | | | |
|---|---|---|---|
| 3,614,541 A | 10/1971 | Farrand | 317/101 |
| 3,614,546 A | 10/1971 | Avins | 174/234 |
| 3,671,812 A | 6/1972 | Peluso et al. | 317/118 |
| 3,713,893 A | 1/1973 | Shirland | 136/89 |
| 3,727,064 A | 4/1973 | Bottini | 250/217 |
| 3,739,462 A | 6/1973 | Hasty | 29/577 |
| 3,746,934 A | 7/1973 | Stein | 317/101 |
| 3,772,776 A | 11/1973 | Weisenburger | 29/628 |
| 3,925,801 A | 12/1975 | Haitz et al. | 357/19 |
| 3,949,274 A | 4/1976 | Anacker | 317/101 |
| 3,959,579 A | 5/1976 | Johnson | 174/68.5 |
| 4,017,963 A | 4/1977 | Beyerlein | 29/577 |
| 4,103,318 A | 7/1978 | Schwede | 361/388 |
| 4,116,518 A | 9/1978 | Pleskac | 339/17 |
| 4,116,519 A | 9/1978 | Grabbe et al. | 339/17 |
| 4,139,726 A | 2/1979 | Penrod et al. | 174/52 |
| 4,158,745 A | 6/1979 | Keller | 174/52 |
| 4,241,493 A | 12/1980 | Andrulitis et al. | 29/572 |
| 4,288,808 A | 9/1981 | Hantusch | 357/68 |
| 4,288,841 A | 9/1981 | Gogal | 361/414 |
| 4,321,418 A | 3/1982 | Dran et al. | 136/251 |
| 4,331,258 A | 5/1982 | Geschwind | 220/359 |
| 4,364,620 A | 12/1982 | Mulholland et al. | 339/17 |
| 4,371,912 A | 2/1983 | Guzik | 361/417 |
| 4,379,259 A | 4/1983 | Varadi et al. | 324/73 |
| 4,394,712 A | 7/1983 | Anthony | 361/411 |
| 4,398,235 A | 8/1983 | Lutz et al. | 361/393 |
| 4,406,508 A | 9/1983 | Sadigh-Behzadi | 339/75 |
| 4,437,235 A | 3/1984 | McIver | 29/840 |
| 4,451,973 A | 6/1984 | Tateno et al. | 29/588 |
| 4,521,828 A | 6/1985 | Fanning | 361/386 |
| 4,525,921 A | 7/1985 | Carson et al. | 29/577 |
| 4,571,663 A | 2/1986 | McPherson | 361/393 |
| 4,574,331 A | 3/1986 | Smolley | 361/393 |
| 4,587,596 A | 5/1986 | Bunnell | 361/398 |
| 4,630,172 A | 12/1986 | Stenerson et al. | 361/386 |
| 4,631,573 A | 12/1986 | Sutrina | 357/82 |
| 4,633,573 A | 1/1987 | Scherer | 29/589 |
| 4,638,348 A | 1/1987 | Brown et al. | 357/74 |
| 4,638,406 A | 1/1987 | Samson | 361/403 |
| 4,642,735 A | 2/1987 | Hodsdon et al. | 361/424 |
| 4,680,617 A | 7/1987 | Ross | 357/72 |
| 4,684,975 A | 8/1987 | Takiar et al. | 357/70 |
| 4,688,864 A | 8/1987 | Sorel | 439/74 |
| 4,696,525 A | 9/1987 | Coller et al. | 439/69 |
| 4,698,663 A | 10/1987 | Sugimoto et al. | 357/81 |
| 4,706,166 A | 11/1987 | Go | 361/403 |
| 4,712,129 A | 12/1987 | Orcutt | 357/84 |
| 4,722,060 A | 1/1988 | Quinn et al. | 364/490 |
| 4,722,691 A | 2/1988 | Gladd et al. | 439/79 |
| 4,733,461 A | 3/1988 | Nakano | 29/830 |
| 4,761,681 A | 8/1988 | Reid | 357/68 |
| 4,763,188 A | 8/1988 | Johnson | 357/74 |
| 4,764,846 A | 8/1988 | Go | 361/388 |
| 4,770,640 A | 9/1988 | Walter | 439/69 |
| 4,796,078 A | 1/1989 | Phelps, Jr. et al. | 357/68 |
| 4,821,007 A | 4/1989 | Fields et al. | 333/238 |
| 4,821,148 A | 4/1989 | Kobayashi et al. | 361/392 |
| 4,823,234 A | 4/1989 | Konishi et al. | 361/386 |
| 4,829,403 A | 5/1989 | Harding | 361/386 |
| 4,833,568 A | 5/1989 | Berhold | 361/383 |
| 4,839,717 A | 6/1989 | Phy et al. | 357/74 |
| 4,841,355 A | 6/1989 | Parks | 357/82 |
| 4,855,868 A | 8/1989 | Harding | 361/386 |
| 4,862,245 A | 8/1989 | Pashby et al. | 357/70 |
| 4,862,249 A | 8/1989 | Carlson | 357/80 |
| 4,868,712 A | 9/1989 | Woodman | 361/388 |
| 4,878,106 A | 10/1989 | Sachs | 357/72 |
| 4,884,237 A | 11/1989 | Mueller et al. | 365/63 |
| 4,891,789 A | 1/1990 | Quattrini et al. | 365/63 |
| 4,911,643 A | 3/1990 | Perry et al. | 439/67 |
| 4,924,352 A | 5/1990 | Septfons | 361/288 |
| 4,948,645 A | 8/1990 | Holzinger et al. | 428/40 |
| 4,953,005 A | 8/1990 | Carlson et al. | 357/80 |
| 4,953,060 A | 8/1990 | Lauffer et al. | 361/388 |
| 4,956,694 A | 9/1990 | Eide | 357/74 |
| 4,983,533 A | 1/1991 | Go | 437/7 |
| 4,994,411 A | 2/1991 | Naito et al. | 437/209 |
| 4,996,583 A | 2/1991 | Hatada | 357/70 |
| 4,996,587 A | 2/1991 | Hinrichsmeyer et al. | 357/74 |
| 4,997,517 A | 3/1991 | Parthasarathi | 156/630 |
| 5,001,545 A | 3/1991 | Kalfus et al. | 357/70 |
| 5,012,323 A | 4/1991 | Farnworth | 357/75 |
| 5,014,113 A | 5/1991 | Casto | 357/70 |
| 5,016,138 A | 5/1991 | Woodman | 361/381 |
| 5,025,307 A | 6/1991 | Ueda et al. | 357/80 |
| 5,031,072 A | 7/1991 | Malhi et al. | 361/387 |
| 5,034,350 A | 7/1991 | Marchisi | 437/207 |
| 5,041,015 A | 8/1991 | Travis | 439/492 |
| 5,041,395 A | 8/1991 | Steffen | 437/206 |
| 5,043,794 A | 8/1991 | Tai et al. | 357/74 |
| 5,049,527 A | 9/1991 | Merrick et al. | 437/220 |
| 5,057,903 A | 10/1991 | Olla | 357/72 |
| 5,057,906 A | 10/1991 | Ishigami | 357/80 |
| 5,058,265 A | 10/1991 | Goldfarb | 29/852 |
| 5,065,277 A | 11/1991 | Davidson | 361/383 |
| 5,068,708 A | 11/1991 | Newman | 357/68 |
| 5,086,018 A | 2/1992 | Conru et al. | 437/207 |
| 5,099,393 A | 3/1992 | Bentlage et al. | 361/413 |
| 5,101,324 A | 3/1992 | Sato | 361/400 |
| 5,104,820 A | 4/1992 | Go et al. | 437/51 |
| 5,107,328 A | 4/1992 | Kinsman | 357/74 |
| 5,108,553 A | 4/1992 | Foster et al. | 205/125 |
| 5,128,831 A | 7/1992 | Fox, III et al. | 361/396 |
| 5,138,430 A | 8/1992 | Gow, 3rd et al. | 357/70 |
| 5,138,434 A | 8/1992 | Wood et al. | 357/74 |
| 5,140,745 A | 8/1992 | McKenzie, Jr. | 29/852 |
| 5,151,559 A | 9/1992 | Conru et al. | 174/52.4 |
| 5,155,068 A | 10/1992 | Tada | 438/125 |
| 5,159,434 A | 10/1992 | Kohno et al. | 358/80 |
| 5,168,926 A | 12/1992 | Watson et al. | 165/185 |
| 5,198,888 A | 3/1993 | Sugano et al. | 257/686 |
| 5,200,362 A | 4/1993 | Lin et al. | 437/207 |
| 5,214,307 A | 5/1993 | Davis | 257/676 |
| 5,214,845 A | 6/1993 | King et al. | 29/841 |
| 5,221,642 A | 6/1993 | Burns | 437/207 |
| 5,222,014 A | 6/1993 | Lin | 361/414 |
| 5,223,739 A | 6/1993 | Katsumata et al. | 257/676 |
| 5,231,304 A | 7/1993 | Solomon | 257/684 |
| 5,236,117 A | 8/1993 | Roane et al. | 228/180.21 |
| 5,239,447 A | 8/1993 | Cotues et al. | 361/744 |
| 5,241,454 A | 8/1993 | Ameen et al. | 361/744 |
| 5,243,133 A | 9/1993 | Engle et al. | 174/52.4 |
| 5,247,423 A | 9/1993 | Lin et al. | 361/719 |
| 5,252,857 A | 10/1993 | Kane et al. | 257/686 |
| 5,259,770 A | 11/1993 | Bates et al. | 439/66 |
| 5,262,927 A | 11/1993 | Chia et al. | 361/784 |
| 5,266,834 A | 11/1993 | Nishi et al. | 257/706 |
| 5,273,940 A | 12/1993 | Sanders | 437/209 |
| 5,279,029 A | 1/1994 | Burns | 29/856 |
| 5,279,991 A | 1/1994 | Minahan et al. | 437/208 |
| 5,281,852 A | 1/1994 | Normington | 257/685 |
| 5,307,929 A | 5/1994 | Seidler | 206/331 |
| 5,311,060 A | 5/1994 | Rostoker et al. | 257/796 |
| 5,311,401 A | 5/1994 | Gates, Jr. et al. | 361/760 |
| 5,313,096 A | 5/1994 | Eide | 257/686 |
| 5,313,097 A | 5/1994 | Haj-Ali-Ahmadi et al. | 257/706 |
| 5,343,075 A | 8/1994 | Nishino | 257/686 |
| 5,343,366 A | 8/1994 | Cipolla et al. | 361/785 |
| 5,347,428 A | 9/1994 | Carson et al. | 361/760 |
| 5,347,429 A | 9/1994 | Kohno et al. | 361/813 |

| | | | |
|---|---|---|---|
| 5,367,766 A | 11/1994 | Burns et al. ................. 29/848 |
| 5,369,056 A | 11/1994 | Burns et al. ............... 437/209 |
| 5,369,058 A | 11/1994 | Burns et al. ............... 437/209 |
| 5,371,866 A | 12/1994 | Cady .......................... 395/400 |
| 5,373,189 A | 12/1994 | Massit et al. ............... 257/686 |
| 5,377,077 A | 12/1994 | Burns ......................... 361/704 |
| 5,384,689 A | 1/1995 | Shen ........................... 361/761 |
| 5,394,010 A | 2/1995 | Tazawa et al. .............. 257/686 |
| 5,397,916 A | 3/1995 | Normington ................ 257/686 |
| 5,420,751 A | 5/1995 | Burns ......................... 361/707 |
| 5,426,566 A | 6/1995 | Beilstein, Jr. et al. ...... 361/735 |
| 5,438,224 A | 8/1995 | Papageorge et al. ........ 257/777 |
| 5,446,313 A | 8/1995 | Masuda et al. ............. 257/666 |
| 5,446,620 A | 8/1995 | Burns ......................... 361/704 |
| 5,475,920 A | 12/1995 | Burns et al. ................. 29/856 |
| 5,477,082 A | 12/1995 | Buckley, III et al. ....... 257/679 |
| 5,479,318 A | 12/1995 | Burns ......................... 361/704 |
| 5,481,133 A | 1/1996 | Hsu ............................ 257/621 |
| 5,484,959 A | 1/1996 | Burns ......................... 174/524 |
| 5,493,476 A | 2/1996 | Burns ......................... 361/735 |
| 5,499,160 A | 3/1996 | Burns ......................... 361/704 |
| 5,514,907 A | 5/1996 | Moshayedi ................. 257/686 |
| 5,523,619 A | 6/1996 | McAllister et al. ......... 257/686 |
| 5,543,664 A | 8/1996 | Burns ......................... 257/787 |
| 5,550,711 A | 8/1996 | Burns et al. ................ 361/728 |
| 5,552,963 A | 9/1996 | Burns ......................... 361/735 |
| 5,561,591 A | 10/1996 | Burns ......................... 361/704 |
| 5,566,051 A | 10/1996 | Burns ......................... 361/704 |
| 5,586,009 A | 12/1996 | Burns ......................... 361/735 |
| 5,588,205 A | 12/1996 | Roane ......................... 29/830 |
| 5,592,364 A | 1/1997 | Roane ......................... 361/735 |
| 5,605,592 A | 2/1997 | Burns ......................... 156/182 |
| 5,612,570 A | 3/1997 | Eide et al. ................... 257/686 |
| 5,615,475 A | 4/1997 | Burns ......................... 29/827 |
| 5,631,193 A | 5/1997 | Burns ......................... 29/827 |
| 5,644,161 A | 7/1997 | Burns ......................... 257/668 |
| 5,654,877 A | 8/1997 | Burns ......................... 361/713 |
| 5,657,537 A | 8/1997 | Saia et al. ................... 29/830 |
| 5,723,903 A | 3/1998 | Masuda et al. ............. 257/696 |
| 5,778,522 A | 7/1998 | Burns ......................... 29/830 |
| 5,783,464 A | 7/1998 | Burns ......................... 438/112 |
| 5,789,815 A | 8/1998 | Tessier et al. .............. 257/723 |
| 5,801,437 A | 9/1998 | Burns ......................... 257/685 |
| 5,804,870 A | 9/1998 | Burns ......................... 257/666 |
| 5,828,125 A | 10/1998 | Burns ......................... 257/668 |
| 5,835,988 A | 11/1998 | Ishii ........................... 257/684 |
| 5,843,807 A | 12/1998 | Burns ......................... 438/109 |
| 5,864,175 A | 1/1999 | Burns ......................... 257/684 |
| 5,895,232 A | 4/1999 | Burns ......................... 438/107 |
| 5,917,709 A | 6/1999 | Johnson et al. ............. 361/803 |
| 5,960,539 A | 10/1999 | Burns ......................... 29/854 |
| 5,978,227 A | 11/1999 | Burns ......................... 361/735 |
| 6,014,316 A | 1/2000 | Eide ........................... 361/735 |
| 6,025,642 A | 2/2000 | Burns ......................... 257/686 |
| 6,028,352 A | 2/2000 | Eide ........................... 257/686 |
| 6,028,365 A | 2/2000 | Akram et al. ............... 257/778 |
| 6,049,123 A | 4/2000 | Burns ......................... 257/686 |
| RE36,916 E | 10/2000 | Moshayedi ................. 257/723 |
| 6,133,637 A | 10/2000 | Hikita et al. ................ 257/777 |
| 6,153,929 A | 11/2000 | Moden et al. ............... 257/686 |
| 6,157,541 A | 12/2000 | Hacke ........................ 361/749 |
| 6,168,970 B1 | 1/2001 | Burns ......................... 438/106 |
| 6,172,874 B1 | 1/2001 | Bartilson .................... 361/719 |
| 6,178,093 B1 | 1/2001 | Bhatt et al. ................. 361/795 |
| 6,187,652 B1 | 2/2001 | Chou et al. ................. 438/455 |
| 6,194,247 B1 | 2/2001 | Burns ......................... 438/107 |
| 6,205,654 B1 | 3/2001 | Burns ......................... 29/830 |
| 6,262,476 B1 | 7/2001 | Vidal .......................... 257/686 |
| 6,288,907 B1 | 9/2001 | Burns ......................... 361/783 |
| 6,300,679 B1 | 10/2001 | Mukerji et al. ............. 257/738 |
| 6,303,981 B1 | 10/2001 | Moden ....................... 257/666 |
| 6,310,392 B1 | 10/2001 | Burns ......................... 257/723 |
| 6,313,998 B1 | 11/2001 | Kledzik et al. ............. 361/767 |
| 6,316,825 B1 | 11/2001 | Park et al. .................. 257/686 |
| 6,323,060 B1 | 11/2001 | Isaak .......................... 438/109 |
| 6,335,565 B1 | 1/2002 | Miyamoto et al. .......... 257/686 |
| 6,376,769 B1 | 4/2002 | Chung ....................... 174/52.2 |
| 6,426,240 B2 | 7/2002 | Isaak .......................... 438/106 |
| 6,426,560 B1 | 7/2002 | Kawamura et al. ......... 257/777 |
| 6,462,408 B1 | 10/2002 | Wehrly, Jr. .................. 257/686 |
| 6,489,687 B1 | 12/2002 | Hashimoto .................. 257/777 |

FOREIGN PATENT DOCUMENTS

| | | |
|---|---|---|
| JP | 57-31166 A | 2/1982 |
| JP | 58-112348 A | 4/1983 |
| JP | 58-96756 A | 8/1983 |
| JP | 58-219757 A | 12/1983 |
| JP | 60-160641 | 8/1985 |
| JP | 60-254762 A | 12/1985 |
| JP | 61-63048 | 4/1986 |
| JP | 61-75558 A | 4/1986 |
| JP | 61-163652 A | 7/1986 |
| JP | 61-219143 A | 9/1986 |
| JP | 62-230027 A | 8/1987 |
| JP | 63-117451 A | 5/1988 |
| JP | 63-153849 A | 6/1988 |
| JP | 2-260448 | 10/1990 |
| JP | 3-96266 | 4/1991 |
| JP | 3-167868 A | 7/1991 |
| JP | 4-209562 | 7/1992 |
| JP | 6-77644 | 8/1992 |
| SU | 834-957 | 5/1981 |

OTHER PUBLICATIONS

Dense–Pac Microsystems, Inc., "Memory Products–Short-Form–Q4," 1994, 5 pages.

Dense–Pac Microsystems, Inc., "Short Order Catalog," 1990, 12 pages.

Dense–Pac Microsystems, Inc., "Short–Form Catalog," 1991, 20 pages.

Dense–Pac Microsystems, Inc., "3–D Technology," 1993, 15 pages.

Dense–Pac Microsystems, Inc., 16–Megabit High Speed CMOS SRAM.

Dense–Pac Microsystems, Inc., 128–Megabyte SDRAM Sodimm.

Dense–Pac Microsystems, Inc., 256–Megabyte CMOS DRAM.

Dense–Pac Microsystems, Inc. flyer "While others are still defining it . . . Our customers are cashing in!".

Tuckerman, D.B. et al., "Laminated Memory: A New 3–Dimensional Packaging Technology for MCMs" article, nCHIP, Inc., IEEE, 1994.

1992 Proceedings, 42$^{nd}$ Electronic Components & Technology Conference, May 18–20, 1992.

Research Disclosure, Organic Card Device Carrier, 31318. May 1990, No. 313.

"Introducing a Revolutionary 3 Dimensional Package Type The SLCC," John Forthun, Advancement in Technology, Feb. 26, 1992, 12 pages.

"New Levels of hybrid IC density are provided by Three–Dimensional Packaging" article, 2 pages.

3–D Integrated Packaging and Interconnect Technology, Wescon 90 Conference Record, held Nov. 13–15, 1990, Anahein, CA.

Christian VAL and Thierry Lenoin, 3d Interconnection for Ultra–Dense Multichip Modules, IEEE, pp. 540–547.

Dean Frew, "High Density Memory Packaging Technology High Speed Imaging Applications,"SPIE vol. 1346 *Ultra–high–and High–Speed Photography, Videography, Photonics, and Velometry '90*, pp. 200–209.

Alvin Weinburg and W. Kinzy Jones, "Vertically–Integrated Package," IEEE, pp. 436–443.

IBM Technical Disclosure Bulletin, vol. 20, No. 11A Apr. 1978.

IBM Technical Disclosure Bulletin, vol. 23, No. 12 May 1981.

IBM Technical Disclosure Bulletin, vol. 32 No. 3B Aug. 1989.

"Alternative assembly for Memory Ics" XP–002093051, Electronic Engineering, Jan. 1987, p. 22.

international Electron Device Meeting, IEDM Technical Digest, Washington, D.C., Dec. 6–9, 1987.

Patent Abstract of Japan, Publication No. 05029534, Published May 2, 1993, Inventor: Nakamura Shigemi, entitled "Memory Module", European Patent Office.

Chip Scale Review Online—An Independent Journal Dedicated to the Advancement of Chip–Scale Electronics. (Webiste 9 pages) Fjelstad, Joseph, Pacific Consultants, L.L.C.

Flexible Thinking: Examining the Flexible Circuit Tapes. (Website 2 pages) Fjelstad, Joseph.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002.

Flexible Printed Circuit Technology—A Versatile Interconnection Option, (Website 2 pages) Fjelstad, Joseph. Dec. 3, 2002.

HIGH DENSITY INTEGRATED CIRCUIT MODULE

CROSS-REFERENCE TO RELATED APPLICATION

This application is a divisional of application Ser. No. 09/222,263, filed Dec. 28, 1998 now U.S. Pat. No. 6,205, 654, which is a continuation-in-part of application Ser. No. 08/774,699, filed Dec. 26, 1996, abandoned, which is a continuation of 08/497,565, filed Jun. 30, 1995, now issued as U.S. Pat. No. 5,631,193, which is a continuation of application Ser. No. 07/990,334, filed Dec. 11, 1992, now issued as U.S. Pat. No. 5,484,959.

BACKGROUND OF THE INVENTION

1. Field of the Invention

This invention relates to a high density, integrated circuit module, which includes a plurality of vertically or horizontally stacked individual surface mount or ball-grid-array integrated circuit packages.

2. Brief Description of the Related Technology

An example of a fabrication method and apparatus for high density lead-on-package modules by laminating one or more lead frames to standard integrated circuit packages is disclosed in U.S. Pat. No. 5,484,959, assigned to the common assignee of the present invention and incorporated herein by reference. Other methods for providing high density, stacked modules are disclosed in U.S. Pat. Nos. 5,279,029, 5,367,766, 5,455,740, 5,450,959 and 5,592,364, all of which are assigned to the common assignee of the present invention and incorporated herein by reference. The general methods and apparatus disclosed in the referenced patents can be applied to the fabrication of stacked configurations comprised of individual ball-grid-array or surface mount packages. However, the characteristic lead orientation, lead shape and lead content of ball-grid-array or surface mount packages impose a different set of parameters not adequately provided for by prior methods and assemblies.

SUMMARY OF THE INVENTION

The present invention provides a novel method and apparatus for manufacturing three-dimensional, high density, integrated circuit modules from standard ball-grid-array or other surface mount integrated circuit packages which provides improved space efficiency and heat dissipation. One way to increase space efficiency is to stack individual packages. Generally speaking, higher density generates more localized heat and thus increases the need for efficient heat dissipation. Improving the thermal transfer characteristics of the individual integrated circuit packages results in better heat dissipation for the module, and improves reliability and durability.

The present invention provides a novel method of fabricating a three-dimensional module formed of stacked and aligned surface mount or ball-grid-array packages. Ball-Grid-Array (BGA) integrated circuit packages typically have leads that extend from the bottom surface of a rectangular solid resin casing in a two-dimensional grid pattern. The external portion of each lead finished with a ball of solder. Package leads provide electrical and thermal coupling to one or more integrated circuit dies that are embedded within the protective casing. Typically, the protective casing completely surrounds the embedded die but, in some BGA packages, the protective casing does not cover the inactive top surface of the die. Near-chip scale packages provide 1.0 mm center-to-center lead spacing. Chip scale packaging such as MICRO_BGA™ have center-to-center lead spacing of 0.5 mm. Chip scale packaging offers excellent electrical characteristics including low capacitance and thermal design.

Connectivity to the leads of individual packages in a module is provided by thin substantially planar lead carriers located between adjacent packages. Lead carriers are adhered to adjacent packages with a thermally conductive but electrically insulating adhesive. A lead carrier is comprised of elongated electrically and thermally conductive elements formed in one or more thin planes of conductive material that are separated by high-dielectric material. Typically, each conductive element has at least one aperture, adapted to receive and electrically couple to an individual package ball and at least one interconnect lead that extends away from the module to provide external circuit connectivity to package leads. Preferably, the lead carriers are formed from custom flexible circuits commercially available from 3M™ or other manufacturers. These well known flexible circuits are typically comprised of one or more thin layers of conductive material that are die cut and drilled to form ground planes, signal traces, pads and apertures. The conductive layers are typically embedded in and between electrically-insulating, high-dielectric material such as polyamide, polyester or teflon which results in circuits that are flexible, have dense trace, and provide accurate impedance control.

The present invention utilizes standard manufactured packages to form the multi-package module. Such packages typically have ball irregularities or inconsistencies, particularly ball length and solder coating variations. These variations make automated assembly problematic since the tolerances necessary to accommodate variation in ball length and excess solder, for example, do not permit the packages to be assembled within the more stringent requirements for automated assembly of the module. According to one aspect of the present invention, the leads of the ball-grid-array packages are scythed prior to assembly or as an automated step during the assembly. Scything is a method where a hot razor knife skims off a layer from the distal end of all the leads of a ball-grid-array package, reducing random excess lead length and providing a uniform, closely tolerant lead length. The step of scything allows multiple packages to be added to the module prior to a final heating step where the solder for all the packages is flowed. This method also has the advantage of increasing the minimal tolerances for positioning of ball-grid-array package on the lead carrier. An alternative method that may also be used to compensate for excess solder from the leads is to provide channels formed in the walls or edges of each aperture of the lead carrier that receives the ball so the excess solder, when heated, flows into the channels A channel is a void area in a conductive element which merges into the void area of an aperture. An edge of the channel is in close proximity to the package leads and the void area extends away from the leads. Channels take advantage of the surface tension of molten solder which will pull molten solder away from leads to fill the channel.

Another object of the present invention is to provide an assembly which effectively dissipates heat generated during normal operation. Efficient thermal management increases the operational life of the module, and improves reliability by eliminating the effects of elevated temperature on the electrical characteristics of the integrated circuit and packaging. When packages are not stacked, heat from the embedded integrated circuits, generated through normal operation, is primarily dissipated by convection from the package's external surfaces to the surrounding air. When modules are formed by stacking packages, the buried packages have reduced surface area exposed to the air. The use of thermally conductive adhesive facilitates the transmission of heat between adjacent packages and is an effective method of taking advantage of the exposed surfaces for removing heat from buried packages.

In the module of the present invention, the package leads are thermally coupled to the lead carrier and provide a path for heat from the embedded integrated circuits. Thermally conductive adhesive also facilitates transfer of heat from packages to the lead carrier.

In applications where it is desirable to reduce the package and module height, or where package or module warping is a concern, each package may be constructed using any of the various techniques described in U.S. Pat. Nos. 5,369,056, 5,369,058 and 5,644,161, each of which is assigned to the common assignee of the present invention and incorporated herein by reference. These patents describe methods for constructing thin, durable packages and modules with enhanced heat dissipation characteristics and minimal warpage.

A common application of a stacked configuration is memory modules. Most of the leads of each package are electrically connected to corresponding leads of adjacent packages. A method is required to select the individual memory package being read, written or refreshed. One method is to provide a custom manufactured lead carrier for each package. A more cost-effective method is to use a common lead carrier design with extra package interconnect leads which is then modified by clipping off or no-connecting selected interconnect leads to make each lead carrier in a stacked configuration unique. Methods for connecting a unique bit of a data word per package and for uniquely addressing each package in a stacked configuration are described in U.S. Pat. Nos. 5,279,029 and 5,371,866, both which are assigned to the common assignee of the present invention and incorporated herein by reference. While the apparatus and methods of the present invention are described herein with reference to standard, single-size packages, it will be appreciated by those of ordinary skill in the art, that those methods and apparatus are equally applicable to multiple-die packages.

DETAILED DESCRIPTION OF THE PREFERRED EMBODIMENTS

Other and further objects, features and advantages will be apparent from the following description of the preferred embodiments of the invention, given for the purpose of disclosure and taken in conjunction with the accompanying drawings.

The letter of a reference character containing numerics followed by a letter, either identifies the relative placement of the referenced element within a stacked module or it identifies a specific embodiment.

Figure 1:
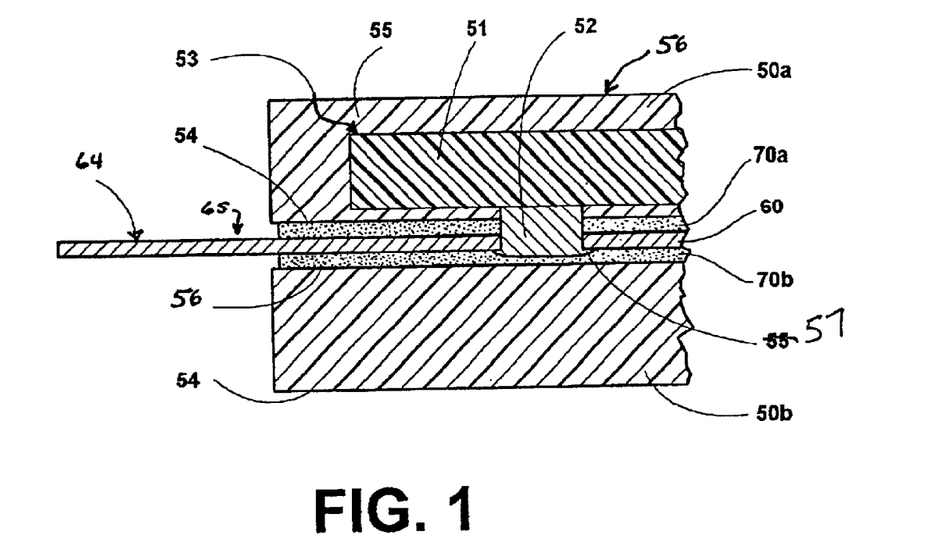
FIG. 1 is a cross-sectional view of two adjacent packages of a module of the present invention.

Referring now to FIG. 1, a typical ball-grid-array package 50 is comprised of an integrated circuit 51 surrounded by an essentially rectangular solid resin casing 55. Package leads 52 extend from the bottom surface 54 of the casing in a two-dimensional grid pattern providing electrical and thermal coupling to one or more integrated circuit die 51 that are embedded within the protective casing. The external portion of each package lead 52 includes a coating of solder having a semi-spherical shape. Typically, the protective casing 55 completely surrounds the embedded die but, in some ball-grid-array packages 50, the protective casing 55 does not cover the inactive top surface 53 of the die. Near-chip scale packages 50 provide 1.0 mm center-to-center spacing between leads 52. Chip scale packaging such as MICRO__ BGA™ have center-to-center lead spacing of 0.5 mm. Chip scale packaging offers excellent electrical characteristics including low capacitance and thermal design.

Figure 4:
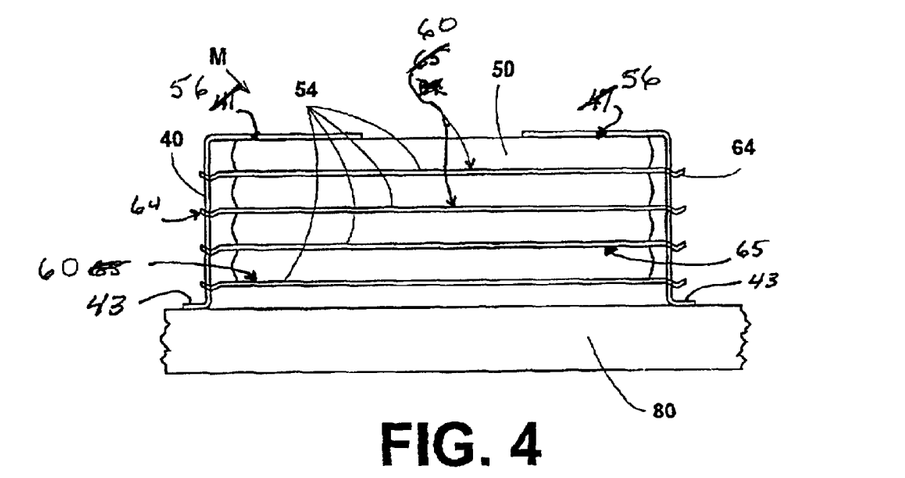
FIG. 4 illustrates a horizontally stacked module of the present invention.
Figure 5:
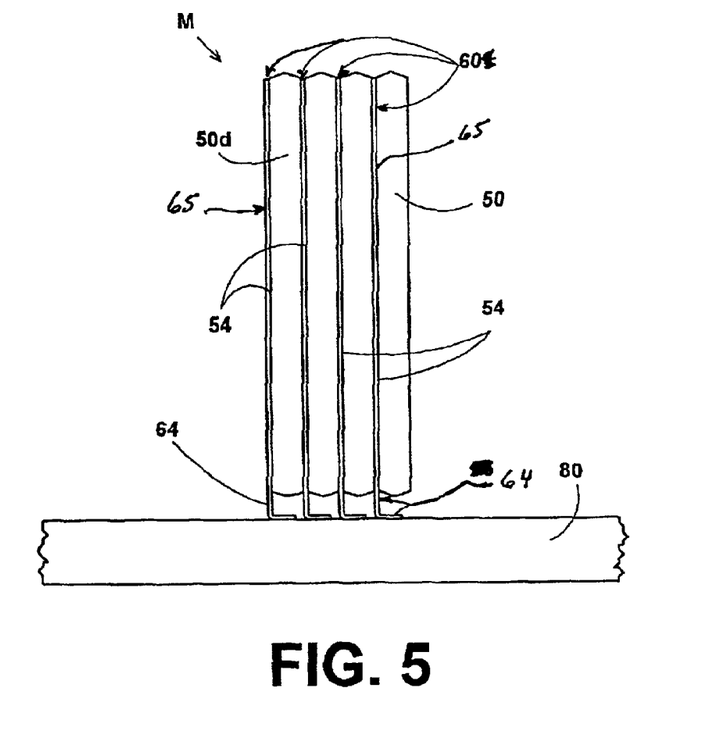
FIG. 5 illustrates a vertically stacked module of the present invention.
Figure 6:
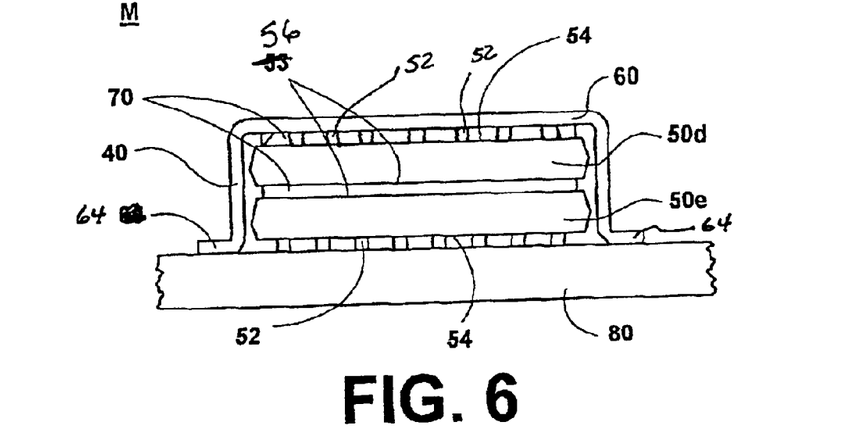
FIG. 6 illustrates an alternative embodiment of a horizontally stacked module of the present invention.
Figure 7:
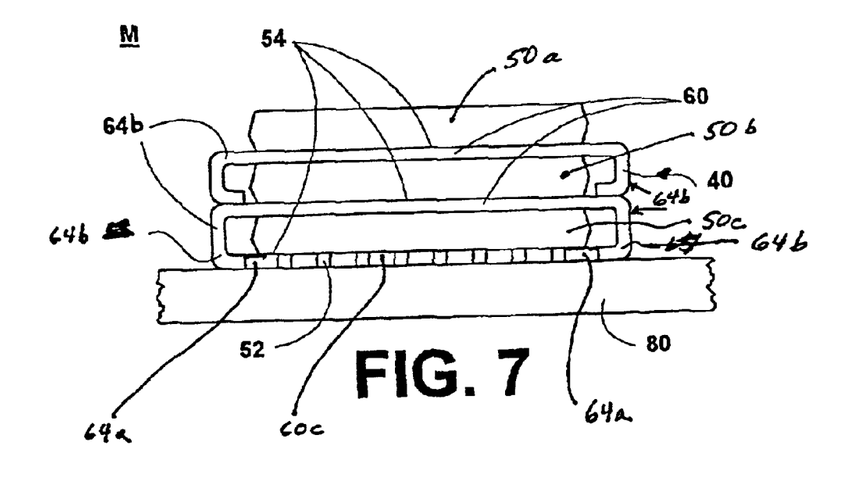
FIG. 7 illustrates an alternative embodiment of horizontally stacked module of the present invention.

FIGS. 4 through 7 show various specific embodiments of stacked module M of the present invention. The letter M designates the module M formed of a plurality of ball-grid-array packages 50. Typically, the packages 50 are aligned as shown in FIGS. 4, 5 and 7 where the bottom surfaces 54 of each package 50 are facing the same direction. Alternately, the packages 50 may be aligned where one or more of the packages 50 are inverted in relation to the other packages 50 as shown in FIG. 6. In this embodiment, the top package 50d is inverted with respect to the bottom package 50e; the top surface 56 of the top package 50d is in substantially full contact with the adhesive 70 on the top surface 56 of the lower package 50e.

Figure 2:
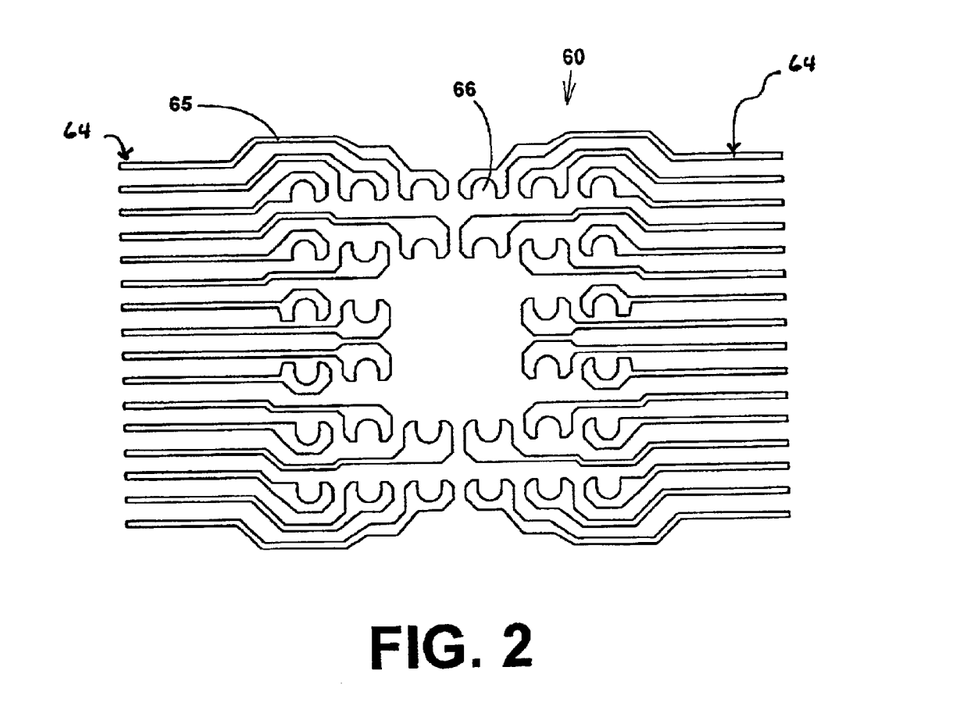
FIG. 2 is a top planar view of a typical lead carrier of the present invention.

A typical application of one aspect of the present invention is shown in FIG. 1 which illustrates a partial cross-section of any two adjacent packages 50 that comprise a module M. The internals of package 50b are not shown for simplicity. FIG. 1 shows two packages 50a and 50b mounted on opposite sides of a lead carrier 60 comprised of a single thin copper plane. Interconnect leads 64 extend away from the module M to provide external circuit connectivity to package leads 52 of the top package 50a. External connectivity may be provided in different configurations as described in detail below with reference to FIGS. 4–7. A typical layout of a single plane lead carrier 60 is shown in FIG. 2. The lead carrier 60 is made to be flexible for increased reliability and ease of assembly. A lead carrier 60 can be comprised of elongated conductive elements 65 formed from a thermally and electrically conductive thin planer material such as beryllium copper alloy C3 having a thickness of about 3 mils. Each conductive element 65 is defined to include a trace, interconnect pad, via and any other conductive feature of the lead carrier that are electrically coupled. Other preferred alloys for the lead-carrier-conductive elements 65 are full hard or hard copper alloys (110 or 197) or olin copper alloy 1094. Preferably, the lead carrier 60 is formed from custom flexible circuits from 3M™ and other manufacturers. These well known flexible circuits are typically comprised of one or more thin (1.4 mils thick) layers of conductive material that are die cut and drilled to form apertures 66, ground planes and conductive elements 65 which include traces, mounting pads and leads. The conductive layers typically are flanked by a thin (typically 1 to 11 mils thick) layer of electrically-insulating, high-dielectric materials such at polyamide, polyester or teflon which results in circuit composites that are flexible. The material and thickness of individual layers that comprise the lead carriers 60 as well as spacing between conductive elements 65 and the width of conductive elements 65 can be precisely controlled to provide accurate and consistent impedance control in select conductive elements 65. Lead carriers 60 formed from custom flexible-circuits can have vias for connecting traces located on different planes and conductive pads (or leads), with solder coating having footprints that are compatible with standards for ball-grid array packages 50 for electrical and mechanical coupling to a printed wiring board 80.

Figure 3A:
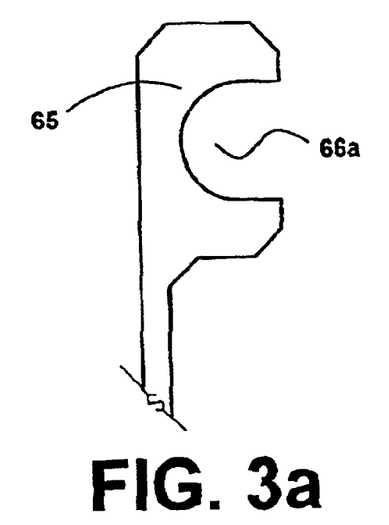
FIG. 3a illustrates the preferred embodiment for an aperture for connection with a package lead of the present invention.

Typically, each conductive element 65 in a lead carrier 60 has at least one aperture 66, adapted to receive an individual package lead 52 and at least one interconnect portion 64 that extends away from the module to provide an external point of electrical connection to package leads 52. Interconnect portions 64 preferably have a spring-like resiliency for increased reliability. Apertures 66 have about the same diameter as a package lead 52 allowing each package lead 52 to extend through the aperture 66 and for the lead carrier 60 to have substantial contact with the bottom surface 54 of a package 50. The application of heat (about 175 degrees centigrade) that is sufficient to cause the solder comprising the package leads 52 to flow will cause the solder to adhere to a thin area of a conductive element 65 on the surface of the lead carrier 60 facing away from the package 50 that surrounds each aperture 66 to form a flange 57 that provides excellent electrical and mechanical coupling between package leads 52 and the lead carrier 60. FIG. 3a illustrates the preferred semi-circle shape 66a for the aperture 66 where the conductive element 65 partially surrounds the package lead 52. The semicircle shape 66a, as opposed to a full-circle shape, enables an increased space for routing the conductive elements 65 of the lead carrier 60.

The present invention utilizes standard manufactured packages 50 to form the multi-package module M. Such packages 50 typically have package lead 52 irregularities or inconsistencies, particularly, lead length and solder coating variations. These variations make automated assembly problematic since the tolerances necessary to accommodate variation in lead 52 length, for example, do not permit the packages 50 to be assembled within the more stringent requirements for automated assembly of the module M. The package leads 52 typically have excess solder that can cause electrical shorts between package leads 52. According to one aspect of the present invention, the leads 52 of the ball-grid-array packages 50 are scythed prior to assembly or as an automated step during the assembly after the lead carrier 60 is attached. Scything is the preferred method of reducing the length by which package leads 52 extend from the package 50. Scything is a method where a hot razor knife skims off the distal portion of all package leads 52.

Referring again to FIG. 1, lead carriers 60 are adhered to adjacent packages 50 with a thermally conductive but electrically-insulating adhesive 70. The adhesive 70 may be epoxy, such as Rogers Corp. R/flex 8970 which is B-staged phenolic butyryl epoxy, that may be laminated at a temperature of 130 degrees centigrade and cured at a temperature of about 175 degrees centigrade. The preferred method is to use a 2 mil thick sandwich of polyamide film 70, such as Kapton™ which includes a 0.5 mil thick layer of adhesive on both sides (a three-layer system). A thermally conductive filled adhesive 70 may be used to enhance the transfer of heat between adjacent packages 50, and between the packages 50 and carrier 60.

Referring now to FIG. 4, a horizontally oriented embodiment of the present invention is illustrated. Typically, a module M is preassembled and then attached to a PWB 80 or other circuit carrying substrate. Alternately, the preassembled module M may be inserted into an integrated circuit socket.

In FIG. 4, a plurality of integrated circuit packages 50, each with an attached lead carrier 60, are stacked in a horizontally-oriented module M. In this configuration, each lead carrier 60 has external interconnect portions 64 which extend from both sides of the module M to provide interconnection to an electrically and thermally conductive external interconnect structure 40. Structure 40 provides mechanical rigidity to the module M and is adhered to the upper surface 56 of the uppermost package 50. Structure 40 also includes circuit board interconnection portions 43 which may be formed for industry-standard socketability with an electrical socket carried in circuit board substrate 80.

A vertically-oriented configuration of module M is illustrated in FIG. 5. In this embodiment, lead carriers 60 are formed with external interconnect portions 64 all extending to one side which requires the conductive elements 65 to be more densely spaced. In this embodiment, external interconnect portions 64 are spaced in row and column configuration for socketing or soldering to circuit connections on circuit board substrate 80.

Another embodiment of module M is illustrated with reference to FIG. 6. In this embodiment, module M is formed in a two-high stack comprised of packages 50e and 50d. In this embodiment, package 50e has its package leads 52 mounted directly to corresponding array of external circuit connect pads carried in substrate 80. Upper package 50d is inverted with respect to package 50e and mounted to package 50e with thermally conductive adhesive layer 70. Surface 54 of package 50d includes package leads 52. A lead carrier 60, formed as described above, is adhered to surface 54 of package 50d with thermally conductive adhesive 70. External circuit interconnect portions 64 provide electrical connectivity for upper package 50d to circuit connection pads carried in substrate 80.

Referring now to FIG. 7, module M is shown in an alternative three-high configuration comprised of individual packages 50a, 50b and 50c. A lead carrier 60 is adhered to the package surface 54 of each package. For clarity, package leads 52 are not shown as to packages 50a and 50b. Lead carriers 60 for packages 50a and 50b include external circuit connect portions 64b which are formed to nest together to provide mechanical rigidity and electrical and thermal conductivity for the module M. Lower package 50c has lead carrier 60c adhered to its lower surface 54 in the manner described above with thermally conductive, electrically insulating adhesive. In this embodiment, circuit connection portions 64a of lead carrier 60c are selectively interconnected to connection portions 64b. Package leads 52 of lower package 50c are connected to external circuit connections carried in substrate 80 in a standard ball-grid-array pattern.

According to one specific method of the present invention, a method for manufacture of a module M involves the following steps: (1) mounting an adhesive 70a to the bottom surface 54 of a package 50; (2) aligning and mounting a lead carrier 60 to the adhesive 70 wherein apertures 66 receive the package leads 52; (3) scything of the distal end of all package leads 52; (4) applying heat (about 175 degrees centigrade) to cure adhesive 70 and flow the package lead 52 solder coating; (5) mounting a second thin layer of adhesive 70b to the lead carrier 60; and (6) mounting another package 50 to the adhesive 70b, wherein the top surface 56 of the package 50 has substantial contact with the adhesive. Steps 1 though 6 are repeated for each package 50 added to the module, except steps 5 and 6 are not repeated for the last package 50. For reliability and remanufacturability, it may be desirable to test each package 50 as it is added to the module M.

The preferred method replaces the steps of applying adhesive 70a and 70b with the preliminary step of applying double-sided adhesive tape 70 to both upper and lower surfaces of each lead carrier 60 prior to assembly. The step of applying heat to cause the solder to flow and to cure adhesive 70 after each step of mounting a package 50 is eliminated if the leads 52 of the package 50 are reduced in height prior to assembly and a thin area of the second layer of adhesive 70b around each aperture 66 is left void to allow the package leads 52 to form a flange when heat is applied. The module M may be assembled using a suitably formed manufacturing jig provided to hold individual packages 50 in alignment as they are stacked together with interspaced lead carriers 60 and adhesive carrying tape 70. In this embodiment, the entire module M may be preassembled and a single heating event applied to flow the solder and cure the adhesive 70 as pressure is exerted on the module M to compress the layers.

Figure 3B:
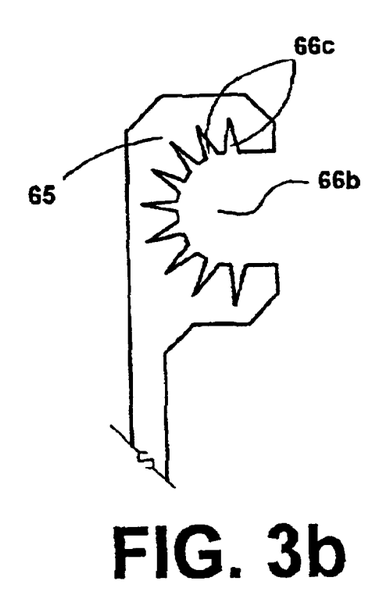
FIG. 3b illustrates an alternative embodiment of an aperture for connection with a package lead of the present invention.

Referring now to FIG. 3b, an alternative embodiment which compensates for excess solder steps utilizes channels 66c formed in each aperture 66b. FIG. 3b illustrates one shape of an aperture 66b with multiple channels 66c. A channel 66c is a void area in a conductive element 65 which merges into the void area of an aperture 66. When a package lead 52 is inserted into the aperture 66b, an edge of each channel 66c is in close proximity to the package leads 52. The void area of the channel 66c extends away from the ball 52. When heat is applied such that the solder coating the package leads 52 becomes molten, excess solder is pulled by the inherent surface tension of molten solder to fill the voided area.

Communication between individual integrated circuits embedded within packages 50 and signals external to the modules are provided by various methods for implementing an external structure. Methods and apparatus of such structures are described in U.S. Pat. Nos. 5,279,029 and 5,367,766. Alternatively, the external structure 40 may be formed integral to the leads 64 extending from the lead carrier 60 as shown in FIGS. 6 and 7. In the embodiment shown in FIG. 7, the leads 64b are formed such to electrically and thermally connect directly to selected adjacent leads 64b. Leads 64 may be formed with a substrate mounting portion that may have a standard "gull-wing," "J-lead" shape.

The foregoing disclosure and description of the invention are illustrative and explanatory of the preferred embodiments. Changes in the size, shape, materials and individual components used, elements, connections and construction may be made without departing from the spirit of the invention.

What is claimed is:

1. An integrated circuit module comprising:
    a first integrated circuit package having a top surface and a bottom surface in which plural package leads extend from the bottom surface;
    a first lead frame having a plurality of electrically and thermally conductive elements each having a package lead reception area and an interconnect extension, the first lead frame mounted to the bottom surface of the first integrated circuit package to align selected package lead reception areas of the conductive elements with selected package leads in a one-to-one correspondence to provide electrically and thermally conductive extensions of the selected package leads through the interconnect extensions of the selected conductive elements;
    an external interconnect structure mounted to the top surface of the first integrated circuit package and having electrically and thermally conductive extensions that make electrical and thermal contact with the interconnect extensions of the selected conductive elements and having interconnection portions that complete a communication path from the package leads through the electrically and thermally conductive elements and the electrically and thermally conductive extensions to allow electrical and thermal conduction to a circuit board substrate while providing mechanical rigidity to the thereby created module.

2. The integrated circuit module of claim 1, in which package lead reception areas include an aperture adapted to receive one of said package leads.

3. The integrated circuit module of claim 2, in which the aperture has a semi-circular shape.

4. The integrated circuit module of claim 2, in which the aperture is formed to include peripheral channels adapted to be filled with excess molten solder.

5. The integrated circuit module of claim 2, in which the interconnect extension of a selected one of said conductive elements is removed.

6. The integrated circuit module of claim 1, further comprising:

a second integrated circuit package having a top surface and a bottom surface in which plural package leads extend from the bottom surface; and a first adhesive layer and second adhesive layer, wherein said first adhesive layer is located between the top surface of the first lead frame and the bottom surface of the first integrated circuit package and the second adhesive layer is located between the bottom surface of the first lead frame and the top surface of the second integrated circuit package to form a module.

7. The integrated circuit module of claim 6, in which the adhesive layer is thermally conductive.

8. The integrated circuit module of claim 1, further comprising:

(a) a substrate mounting portion for mounting a stacked multiple package module on the substrate with the substrate mounting portion, the substrate mounting portion being integral to the distal end of at least one of the interconnect extensions, a substrate attached to said substrate-mounting portions.

9. The integrated circuit module of claim 1, further comprising:

a plurality of electrically and thermally conductive external structures having a substrate mounting portion; and in which a selected one of the external structures is electrically and thermally coupled to a selected one of the interconnect extensions.

10. The integrated circuit module of claim 1, further comprising:

a second lead frame being different in shape from that of the first lead frame and having a plurality of electrically and thermally conductive elements each having a package lead reception area and an interconnect extension in which selected interconnect extensions of said first lead frame and the corresponding interconnect extensions of said second lead frame do not electrically connect to the corresponding package leads.

11. The integrated circuit module of claim 10, in which the lead frames provide a unique address for the selected packages.

12. The integrated circuit module of claim 10, in which the lead frames provide a unique data word bit position for the selected packages.

13. The integrated circuit module of claim 1, in which a selected one of said interconnect extensions of the associated conductive elements is rendered electrically inactive by opening an electrical signal path in the selected one of said conductive elements.

* * * * *